United States Patent
Cheung et al.

[11] Patent Number: 5,453,402
[45] Date of Patent: Sep. 26, 1995

[54] SELECTIVE METAL VIA PLUG GROWTH TECHNOLOGY FOR DEEP SUB-MICROMETER ULSI

[75] Inventors: Robin W. Cheung, Cupertino; Seshadri Ramaswami, San Jose; David F. Kyser, South San Jose, all of Calif.

[73] Assignee: Advanced Micro Devices, Inc., Sunnyvale, Calif.

[21] Appl. No.: 991,031

[22] Filed: Dec. 15, 1992

[51] Int. Cl.$^6$ .................................................. H01L 21/44
[52] U.S. Cl. ............................ 437/195; 437/235; 437/241
[58] Field of Search ........................................ 437/195, 231, 437/235, 241; 148/DIG. 107, DIG. 108, DIG. 134

[56] References Cited

U.S. PATENT DOCUMENTS 4,968,643  11/1990  Mukai .

Primary Examiner—Olik Chaudhuri
Assistant Examiner—C. Everhart
Attorney, Agent, or Firm—Benman Collins & Sawyer

[57] ABSTRACT

Metal pillars (18) having diameters of less than about 1.0 μm are grown in vias (16) in dielectric layers (14) between metal layers (12, 22) by a process comprising: (a) forming a first metal layer (12) at a first temperature and patterning the metal layer; (b) forming the dielectric layer to encapsulate the first patterned metal layer, the dielectric layer having a compressive stress of at least about 100 MegaPascal and being formed at a second temperature; (c) opening vias in the dielectric layer to exposed underlying portions of the patterned metal layer, the vias being less than about 1.0 μm in diameter; (d) heating the semiconductor wafer at a temperature that is greater than either the first or second temperatures to induce growth of metal in the vias from the metal layer; and (e) forming the second metal layer (22) over the dielectric layer to make contact with the metal pillars.

9 Claims, 1 Drawing Sheet

1

SELECTIVE METAL VIA PLUG GROWTH TECHNOLOGY FOR DEEP SUB-MICROMETER ULSI

TECHNICAL FIELD

The present invention relates to semiconductor processing, and, more particularly, to metal plug formation for ultra-large scale integration (ULSI) technology.

BACKGROUND ART

As technology pushes towards sub-micrometer and deep sub-micrometer applications, the speed performance ushers in the requirements of thicker inter-layer dielectric (ILD) for lowering of intra-connects capacitance and hence has resulted in higher aspect ratio for the contacts and vias. Higher current driving capability also requires a highly reliable metalization both in the horizontal and vertical direction. Metal step coverage is one of the key factors that affects the reliability of metalization.

In order to enhance the step coverage and hence reliability, technologists have proposed chemical vapor deposition (CVD) metalization technology, notably selective tungsten and tungsten plug (with etch back), to provide a solution to the problem. These are workable solutions, but suffer from high cost of manufacturing, added complexity and are prone to high particulate generation.

Further, as dimensions get smaller in the deep submicrometer range, it becomes increasingly difficult to define metal pillars or plugs making electrical connection between different levels of metalization.

A need remains for a process of fabricating metal pillars or plugs for making contact between metal layers.

DISCLOSURE OF INVENTION

In accordance with the invention, metal pillars having diameters of less than about 1.0 μm are grown in vias in inter-layer dielectric films between metal layers by a process comprising:

(a) forming a first metal layer at a first temperature over a semiconductor substrate and patterning the first metal layer to form patterned metal regions;

(b) forming the inter-layer dielectric film on the first patterned metal layer, the inter-layer dielectric film encapsulating the patterned metal regions and having a compressive stress of at least about 100 MegaPascal and being formed at a second temperature;

(c) opening vias in the inter-layer dielectric film to exposed underlying portions of the patterned metal layer, the vias being less than about 1.0 μm in diameter;

(d) heating the semiconductor substrate at a temperature that is greater than the first and second temperatures to induce growth of metal in the vias from the metal layer to form metal pillars; and (e) forming the second metal layer on the interlayer dielectric film to contact the metal pillars.

The present invention provides a low cost and innovative approach to the prior art problems and yet has no adverse impact on the complexity of the process. The process of the present invention is well-suited for deep sub-micrometer processing technology.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Figure 1:
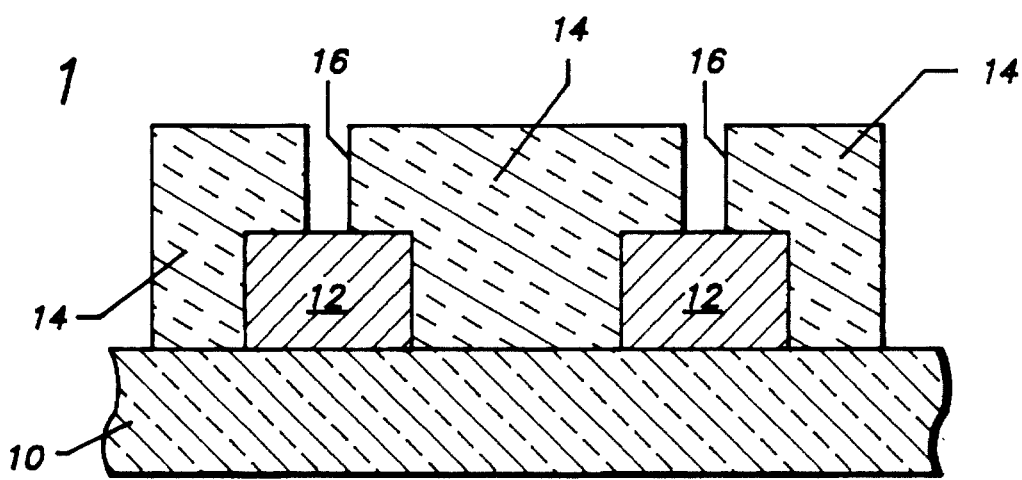
FIGS. 1–3 are cross-sectional views, depicting the process of the invention and the resulting structure.

Reference is now made in detail to a specific embodiment of the present invention, which illustrates the best mode presently contemplated by the inventors for practicing the invention. Alternative embodiments are also briefly described as applicable.

Silicon wafers, comprising a silicon substrate 10 and devices (not shown) formed therein are processed by conventional process technology all the way through first metalization 12, including the formation of source and drain regions and gate regions, with gate oxides and gate electrodes. Such processing is conventional and forms no part of this invention.

The metalization 12 is the conventional Al-based alloy. It may be doped with 0 to 4 wt % silicon and/or 0 to 4 wt % copper or refractory metal, such as titanium and scandium. For best selective results, pure Al should be used, since the presence of any dopant may inhibit growth. The temperature of deposition should be less than that of the inter-layer dielectric film deposition temperature described below.

Following the formation of the first metal layer 12, it is patterned, employing well-known patterning techniques, to leave patterned regions.

Next, an inter-layer dielectric (ILD) film 14 is formed on the patterned metal regions 12. The ILD film 14 is formed by conventional chemical vapor deposition (CVD) techniques, and encapsulates the patterned metal regions 12. Examples of materials suitably employed as the ILD film 14 include $SiO_2$ and $Si_3N_4$, such as formed by CVD using silane-based chemistry or TEOS (tetra-ethyl ortho silicate)-based chemistry or spin-on-materials or a combination thereof.

The ILD film 14 should be highly compressive. The intrinsic stress should be $\geq 100$ MegaPascal. However, if the intrinsic stress is too high, it may crack the silicon substrate. Accordingly, the intrinsic stress preferably ranges from about 100 to 800 MegaPascal. The compressive stress aids in forcing the metal growth, described below.

The ILD film 14 is preferably grown at a temperature ranging from about 300° to 400° C., as this temperature range provides a more controllable stress to the film. The specific choices of ILD growth chemistry and deposition parameters (power, pressure, RF value, and the like) contribute to the stress obtained, and the relationship of these parameters to stress is known in the prior art.

Via openings 16 are formed in the ILD layer 14 by conventional methods. The via openings 16 should be free of any foreign materials except the Al-based metalization. If an anti-reflection coating (ARC) is used, it also must be removed from the via opening area. The resulting structure is depicted in FIG. 1.

The only requirement is that the metalization, i.e., aluminum-based alloy, has to be exposed in the contact/via area. All the openings have to be of substantially the same size, i.e., less than 1.0 μm in diameter. Larger openings will not permit the selective metal growth, described below, that is desired in accordance with the invention.

The via openings 16 all should be below 1.0 μm in diameter. The smaller the diameter, the better the selective growth, described below, will be. Larger openings will not permit the selective growth.

Figure 2:
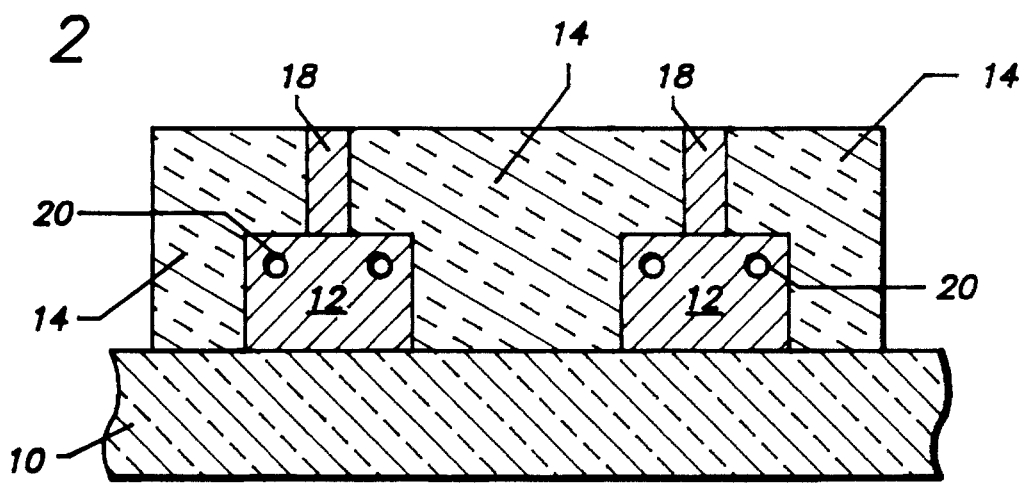

Next, the wafer is subjected to heat treatment at a temperature higher than the ILD/CVD deposition temperature; the use of a higher temperature creates aluminum growth by thermal expansion. The heat treatment temperature preferably ranges from greater than about 300° C. to about 550° C., and is limited at the upper end by the melting point of aluminum (or aluminum alloy). The exact temperature can be optimized to generate the amount of growth desired. This heat treatment promotes growth of metal pillars 18 in the vias 16; the growth of the metal pillars is supplied by the metal 12. The resulting structure is depicted in FIG. 2.

The metal growth is a function of the temperature of heat treatment. The heat treatment can be performed either in a furnace under forming gas environment or in a heater block by lamp heating or by resistive heating. As indicated above, the temperature must be higher than the ILD/CVD deposition temperature.

The reason for forming a highly compressed inter-layer dielectric film 14 is based on the well-known phenomenon that a rigidly encapsulated Al-based metalization 12 will behave like toothpaste under squeezing pressure if the wafer 10 with the structure is reheated to near or above the deposition temperature of the encapsulating CVD.

When the encapsulated metal 12 is heated up, the stress changes, following an hysteresis curve. First, the stress will decrease and then go through a region of plastic deformation. This is a physical process of stress relief. The deflection point is roughly 50° to 100° C. higher than the metal deposition temperature. The metal 12 will also undergo what is termed hillock formation if the metal is not encapsulated. Hillocking is a process of releasing the stress in the metalization. But if the metalization is encapsulated, as shown in FIG. 1, then hillocking is not possible. So, stresses will keep on growing. Any outlet, such as the vias 16, serves as a vent for the stress relief process.

Uncontrolled metal growth will occur if any anti-reflection coating is present covering the top surface of the metal 12, which is why such a coating must be removed prior to the heat treatment process of the present invention.

If there is no anti-reflection coating on top of the metal 12 exposed in the via openings 16, then metal will extrude uniformly to form the self-growth metal plug 18 disclosed herein.

The size of the via 16 therefore is important. If the hole is too large, then the metal 12 has enough surface to relieve the stresses by hillock formation, and there will be no selective growth.

Typically, about 3% of the volume of the metalization 12 will be used in the self-growth vias 18, due to the difference in the thermal expansion coefficients of the metal 12 and the dielectric 14. If there is too little volume of metalization to be available, then the vias 16 will not be completely filled. This is the reason why smaller contact/vias will give better results. The teachings of this invention are best suited for deep sub-micrometer technology applications. Extra metalization may need to be designed in the vicinity of the vias 16 to supply the growth process with enough material. However, this is readily determined by simple experimentation.

The 3% value comes from the thermal expansion mismatch between the CVD film 14 and the metalization film 12. That is, this is the difference between the thermal expansion coefficient of the metal 12 and that of the CVD encapsulation 14. The assumption is made that the metal 12 is fluid and the CVD 14 is rigid. That is to say, the metal 12 will yield under stressing conditions. The 3% number comes from the assumption temperature of processing, i.e., CVD layer 14 deposited at about 400° C. and the system finally stabilized at room temperature.

That is all the volume available for the via growth 18. Therefore, if the total volume of vias 16 is higher than the 3% volume of the encapsulated metalization then the vias will not be completely filled. The required volume and available volume can be used to define the filling capability for application for different design rules.

Voids 20 will be formed in the metal layer 12 as materials are used up in this self-growth process from the first layer of metalization. The total volume of the voids will be about 3% of the total volume of the metalization, again, due to the difference in thermal expansion coefficients. However, these void 20 are not expected to interfere with the electrical properties of the metal pillars 18.

Figure 3:
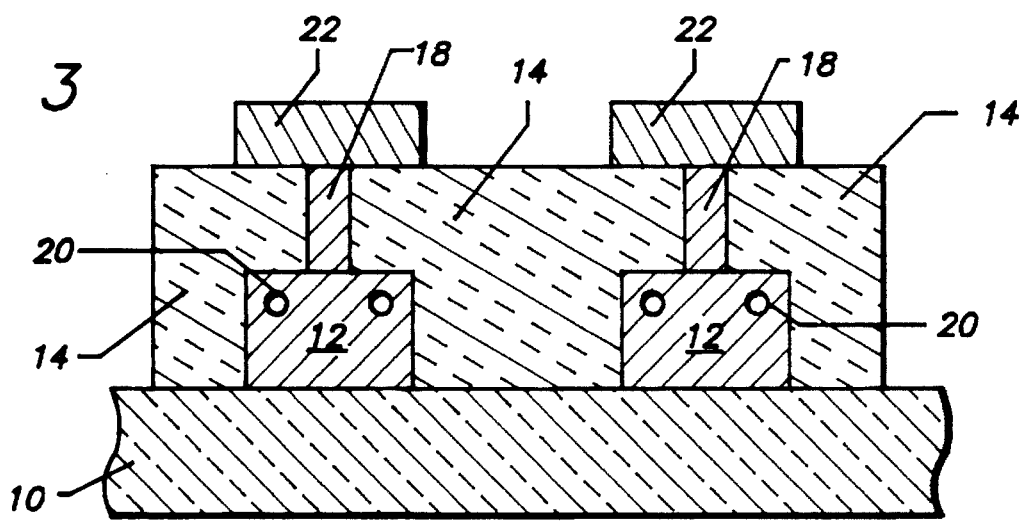

The foregoing steps of forming a metal layer 12, a dielectric layer 14 thereover, vias 16 in the dielectric layer, and metal pillars 18 in the vias with concomitant voids 20 in the dielectric layer may be repeated as necessary to provide the number of metalization layers required. FIG. 3 depicts the structure resulting from the formation of a second metal layer 22 formed on top of the ILD film 14 and contacting the metal pillars 18.

The present invention provides selective metal via plug 18 growth technology. The selective growth only takes place only in sub-micrometer and deep sub-micrometer vias 16. No selective growth occurs in larger via openings. This technology works best at smaller line width applications.

INDUSTRIAL APPLICABILITY

The selective metal via plugs 18 formed by the process of the invention are expected to find use in deep sub-micrometer ultra-large scale integration.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for interconnecting a first layer of metal with a second layer of metal in which an inter-layer dielectric film is formed on said first metal layer and said second metal layer is then formed on said dielectric film, comprising:

(a) forming said first metal layer at a first temperature over a semiconductor substrate and patterning said first metal layer to form patterned metal regions;

(b) forming said inter-layer dielectric film on said first patterned metal layer, said inter-layer dielectric film encapsulating said first patterned metal regions and having a compressive stress of at least about 100 MegaPascal and being formed at a second temperature;

(c) opening vias in said inter-layer dielectric film to expose underlying portions of said first patterned metal layer, said vias being less than about 1.0 μm in diameter;

(d) heating said semiconductor substrate at a temperature that is greater than said first and second temperatures to induce growth of metal in said vias from said first metal layer to form metal pillars; and (e) forming said second metal layer on said inter-layer dielectric film to contact said metal pillars.

2. The process of claim 1 wherein said first temperature is less than said second temperature.

3. The process of claim 1 wherein said first metal layer comprises aluminum or an aluminum alloy.

4. The process of claim 1 wherein said inter-layer dielectric film is selected from the group consisting of $SiO_2$ and $Si_3N_4$.

5. The process of claim 1 wherein said inter-layer dielectric film is formed at a temperature of about 300° to 400° C.

6. The process of claim 1 wherein said compressive stress ranges from about 100 to 800 MegaPascal.

7. The process of claim 1 wherein said heating in step (d) is done at a temperature of greater than about 300° to about 550° C.

8. The process of claim 1 further comprising forming an anti-reflection coating on said first metal layer, then forming said inter-layer dielectric film on said anti-reflection coating.

9. The process of claim 8 wherein after forming said vias in step (c), said anti-reflection coating covering said first metal layer that is exposed in said vias is removed prior to said heating in step (d).

* * * * *